(12) United States Patent
Taylor et al.

(10) Patent No.: US 6,410,990 B2
(45) Date of Patent: *Jun. 25, 2002

(54) INTEGRATED CIRCUIT DEVICE HAVING C4 AND WIRE BOND CONNECTIONS

(75) Inventors: Gregory F. Taylor; George L. Geannopoulos, both of Portland, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,946

(22) Filed: Dec. 12, 1997

(51) Int. Cl.[7] .......................... H01L 23/48; H01L 23/52
(52) U.S. Cl. ..................... 257/786; 257/207; 257/208; 257/691; 257/778
(58) Field of Search ................ 257/203, 207, 257/208, 210, 778, 779, 780, 781, 786, 690, 691, 693, 734, 737, 738, 692; 361/767, 777, 808; 438/108, 128, 129, 612, 613, 614, 666

(56) References Cited

U.S. PATENT DOCUMENTS

| | | | | |
|---|---|---|---|---|
| 5,373,111 A | * | 12/1994 | McClure et al. | 361/767 |
| 5,541,449 A | * | 7/1996 | Crane, Jr. et al. | 257/692 |
| 5,686,764 A | * | 11/1997 | Fulcher | 257/778 |
| 5,786,630 A | * | 7/1998 | Bhansali et al. | 257/697 |
| 5,844,317 A | * | 12/1998 | Bertolet et al. | 257/773 |
| 5,866,943 A | * | 2/1999 | Mertol | 257/778 |

OTHER PUBLICATIONS

Mated Array Chip Configuration, IBM Technical Disclosure Bulletin, vol. 28, No. 2, pp. 811–812, Jul. 1985.*

* cited by examiner

Primary Examiner—Steven Loke
Assistant Examiner—Hung Kim Vu
(74) Attorney, Agent, or Firm—Blakely, Sokoloff, Taylor & Zafman LLP

(57) ABSTRACT

An integrated circuit having a first plurality of wire bond pads located along a horizontal axis, a second plurality of wire bond pads located along a vertical axis, and a plurality of C4 pads arranged in a grid array wherein each grid is defined by the intersection of one of the first wire bond pads and one of the second wire bond pads.

2 Claims, 5 Drawing Sheets

US 6,410,990 B2

INTEGRATED CIRCUIT DEVICE HAVING C4 AND WIRE BOND CONNECTIONS

FIELD OF THE INVENTION

The present invention relates to a connection network for providing power, ground and I/O signals to an integrated circuit device and, more particularly, to an integrated circuit device having both C4 and wire bond pads.

BACKGROUND OF THE INVENTION

Within the integrated circuit industry there is a continuing effort to increase integrated circuit speed as well as device density. As a result of these efforts, there is a trend towards using flip chip technology when packaging complex high speed integrated circuits. Flip chip technology is also known as controlled collapse chip connection (C4) technology. In C4 technology, the integrated circuit die is flipped upside down. This is opposite to how integrated circuits are packaged today using wire bond technology. By flipping the integrated circuit die upside down, solder balls may be used to provide direct electrical connections from the bond pads of the die directly to a corresponding set of pads on a package.

In the following discussion, reference will be made to a number of drawings. The drawings are provided for descriptive purposes only and are not drawn to scale.

FIG. 1 illustrates an integrated circuit die 102 that is housed in a cavity 105 of a PGA (Pin Grid Array) package 110. The integrated circuit die includes a semiconductor substrate 103 having a top surface 107 and a back side surface 108. The active regions 109 of the integrated circuit are formed from the top surface 107 of the semiconductor substrate 103. Wire bonds 104 are used to electrically connect integrated circuit connections in integrated circuit die 102 through internal metal interconnects to the pins 106 of package substrate 110. With the trend towards high speed integrated circuits, the inductance generated in the wire bonds 104 of the typical wire-bonded integrated circuit packaging becomes an increasingly significant problem.

FIG. 2 illustrates a C4 mounted integrated circuit die 202 that is electrically coupled to a PGA (Pin Grid Array) package 210 by ball bonds 204. Die 202 includes a semiconductor substrate 203 that has a top surface 208 and a back side surface 207. The active regions 209 of the integrated circuit are formed from the top surface 208 of the semiconductor substrate 203. Because the bond pads of integrated circuit device 202 are located on the top-side surface 208 of the device, the die must be flipped upside down so that it may be attached to package 210. In comparison with the wire bonds 104 of FIG. 1, the ball bonds 204 of integrated circuit device 202 provide more direct electrical connections between the integrated circuit device 202 and the pins 206 of package substrate 210. As a result, the inductance problems associated with typical integrated circuit wire bond packaging technologies are minimized. Unlike wire bond technology, which only allows bonding along the periphery of the integrated circuit die, C4 technology allows connections to be placed anywhere on the integrated circuit die surface. This leads to a much cleaner and more efficient power distribution to the integrated circuit which is another major advantage of C4 technology.

Although the trend in the industry is moving toward using C4 technology when packaging complex high speed integrated circuits, the use of wire bond technology does offer the advantages of lower costs and better availability.

SUMMARY OF THE INVENTION

The present invention provides an integrated circuit having a plurality of wire bond pads and a plurality of C4 pads with at least one of the C4 pads being electrically coupled to at least one of the wire bond pads.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An integrated circuit device having both wire bond pads and C4 pads is described. In the following description, numerous specific details are set forth in order to provide a thorough understanding of the present invention. However, it will be obvious to one of skill in the art that the invention may be practiced without these specific details. In other instances, well known elements have not been shown in particular detail in order to avoid unnecessarily obscuring the present invention.

Figure 1:
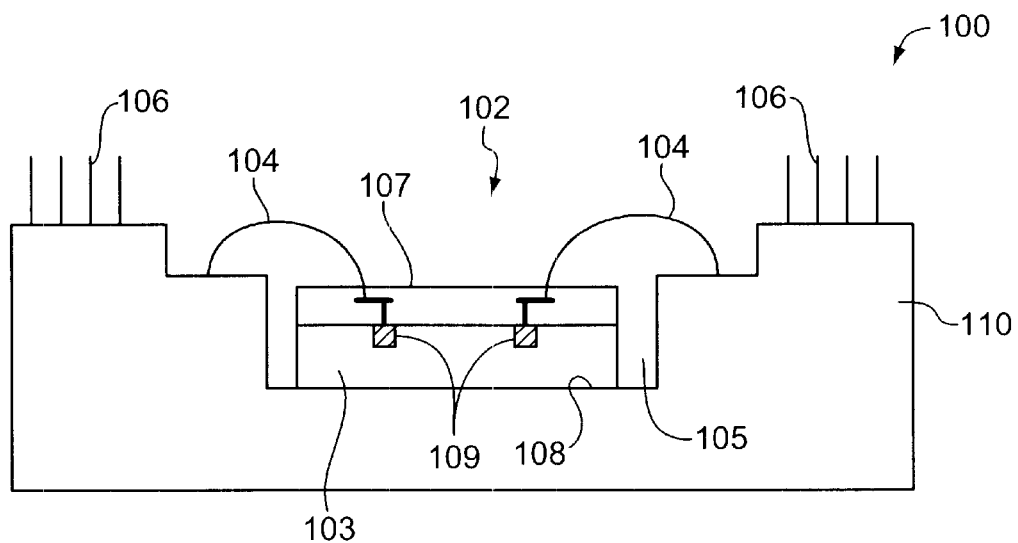
FIG. 1 illustrates an integrated circuit device that is wire bonded to a package using standard wire bond technology.
Figure 2:
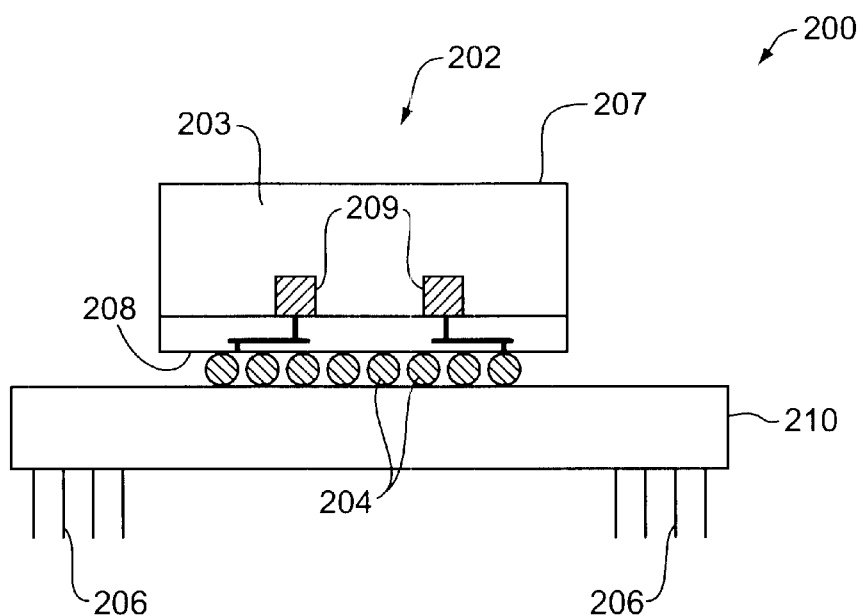
FIG. 2 illustrates an integrated circuit device that is mounted to a package using C4 technology.
Figure 3A:
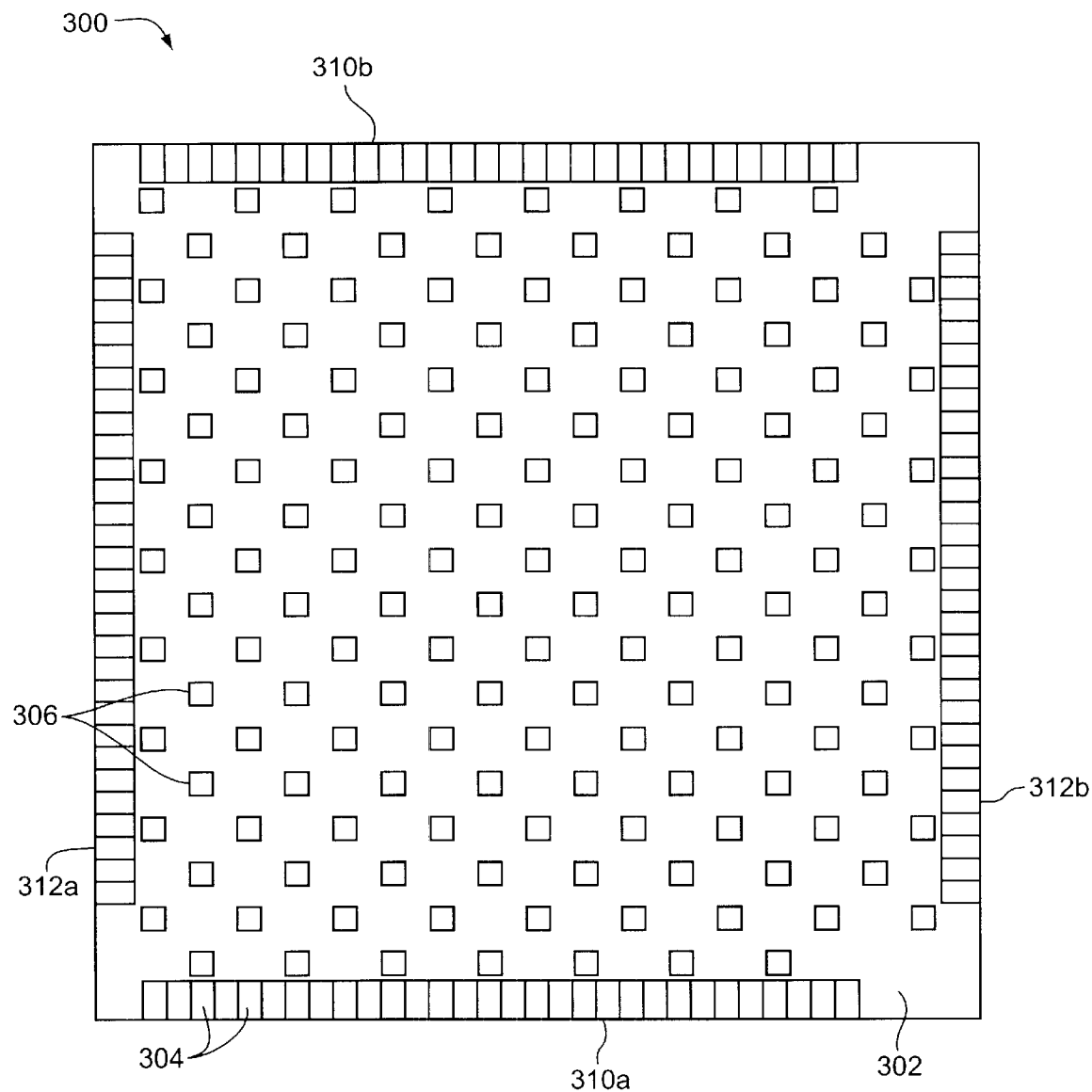
FIG. 3A is a top view of an integrated circuit device having both wire bond pads and C4 bond pads in one embodiment of the invention.

In FIG. 3A, an integrated circuit device 300 is shown having a plurality of wire bond pads 304 and C4 pads 306 located on the frontside 302 of the device. The wire bond pads 304 are arranged along horizontal rows 310a and 310b and vertical rows 312a and 312b. The wire bond pads 304 and C4 pads 306 each include power connections (VCC), ground connections (VSS), and input/output (I/O) connections. In accordance with the present invention, integrated circuit device 300 may be electrically coupled to a package 360 (shown in FIG. 3c) by either of wire bond pads 304, or C4 pads 306.

Figure 3B:
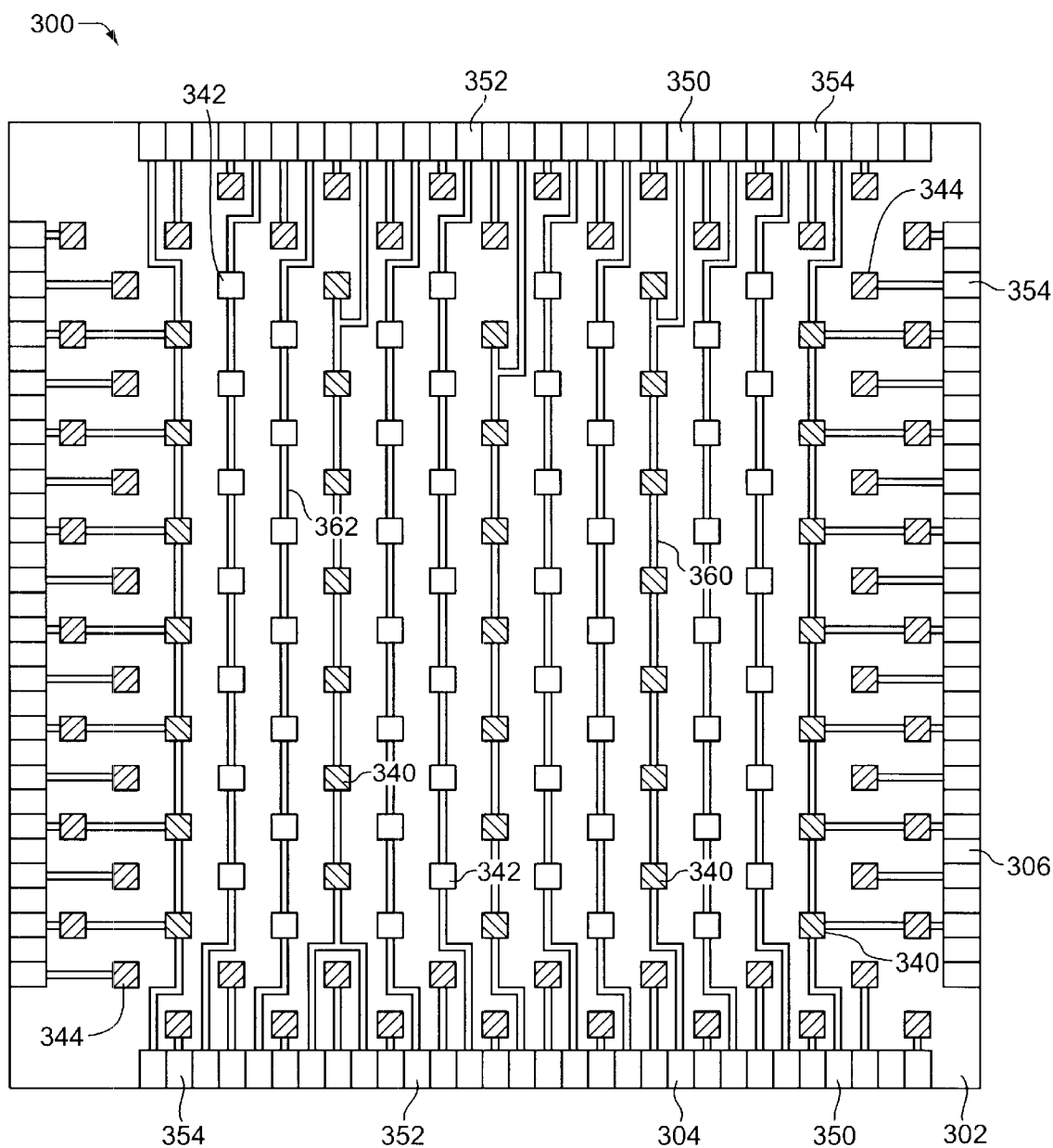
FIG. 3B shows the power, ground and I/O connections of the integrated circuit device shown in FIG. 3A.

As shown in FIG. 3B, each of the C4 pads 306 is electrically coupled to one of the wire bond pads 304 that is located at or near the periphery of the integrated circuit device 300. For simplicity reasons, every wire bond pad is not shown being coupled to a corresponding C4 pad in FIG. 3B. Note, however, that it is preferable that every wire bond pad is to have a corresponding C4 connection.

Figure 3C:
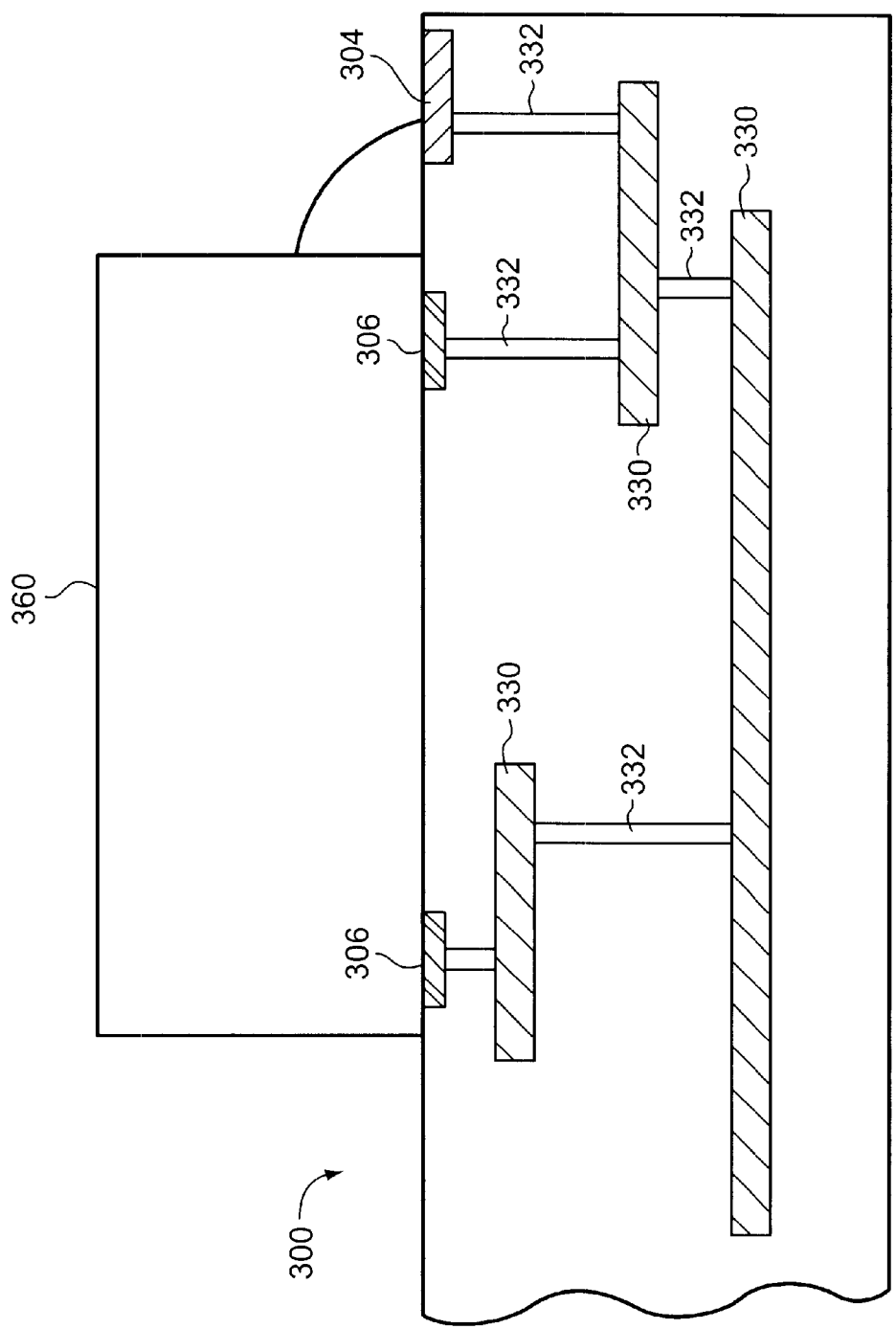
FIG. 3C is a cross-sectional side view of an integrated circuit in one embodiment of the invention.

FIG. 3C shows a cross-sectional side view of a portion of integrated circuit device 300. As shown in FIG. 3C, device 300 includes an electrical interconnection network comprising a plurality of metal layers 330 and conductive vias 332. The wire bond pads 304 are coupled to the C4 pads 306 through the metal layers 330 and conductive vias 332. In another embodiment, the wire bond pads 304 and C4 pads 306 are coupled in the same metal layer.

In order to make it easier to route the electrical connections connecting the wire bond pads 304 to the C4 pads 306, the C4 pads 306 are placed in alignment with the wire bond pads 304. As shown in FIG. 3A, C4 pads 306 are arranged in a grid array with each grid defined by the intersection of one of the wire bond pads in horizontal row 310a or 310b and one of the wire bond pads in vertical row 312a or 312b.

As mentioned above, the wire bond pads 304 and C4 pads 306 each comprise power connections, ground connections and I/O connections. With reference to FIG. 3B, the C4 I/O connections 344 are arranged in two rows along the outer edges of the C4 pad grid array. Each of the C4 I/O connections 344 are electrically coupled to one or more wire bond I/O connections 354. The C4 power connections 340 and ground connections 342 are located within the center portion of the C4 pad grid array. The C4 power connections 340 are arranged in vertical rows and are electrically coupled to form a plurality of power buses 360. Each C4 power bus 360 is electrically coupled to one or more wire bond pad power connections 350. The C4 ground connections 342 are also arranged in vertical rows and are electrically coupled to form a plurality ground buses 362. The C4 ground buses are electrically coupled to one or more wire bond ground connections 352. The C4 pads in the power and ground buses are coupled by traces in the top metal layer of the integrated circuit device. In one embodiment, the metal traces have the same width as the C4 pads to maximize the utilization of the top metal layer. Each ground bus 362 is located adjacent at least one power bus 360. The inductance created by the opposing currents in the adjoining ground and power buses cancels most of the self inductance of these currents. In addition, the power and ground bus arrangement reduces the horizontal inductance resistance (IR) drop between the respective power and ground buses.

In a wire bond die power buses are needed to carry current from the periphery into the core of the die, and back out. The voltage drop due to the long resistance path reduces the power supply voltage across the gates of the integrated circuit. The reduction in voltage reduces the performance of the gates. The resistance path between the power supply and the gates is reduced when C4 bumps are placed along the length of these buses. This results in a lower voltage loss due to IR drops, which in turn results in faster gate speeds. As the number of power supply C4 pads on a die of a given size increases, the density of the C4 pads will also increase resulting in a lower supply voltage IR drop. Since the maximum current density of C4 pads is less than that of the wire bond pads, the wire bond power connections 350 are coupled to the C4 power buses 360 along a metal trace connecting two of the C4 power connections 340 to account for the current density mismatch by distributing the current evenly between two C4 bumps.

As discussed above, in order to provide a wire bond and C4 pad layout that makes it easier to route the electrical connections between the pads, the C4 pads 306 of the present invention are placed in alignment with the wire bond pads 304. In addition to aligning the C4 pads 306 with the wire bond pads 304, the C4 pad layout is arranged in a repeatable fashion.

Figure 4:
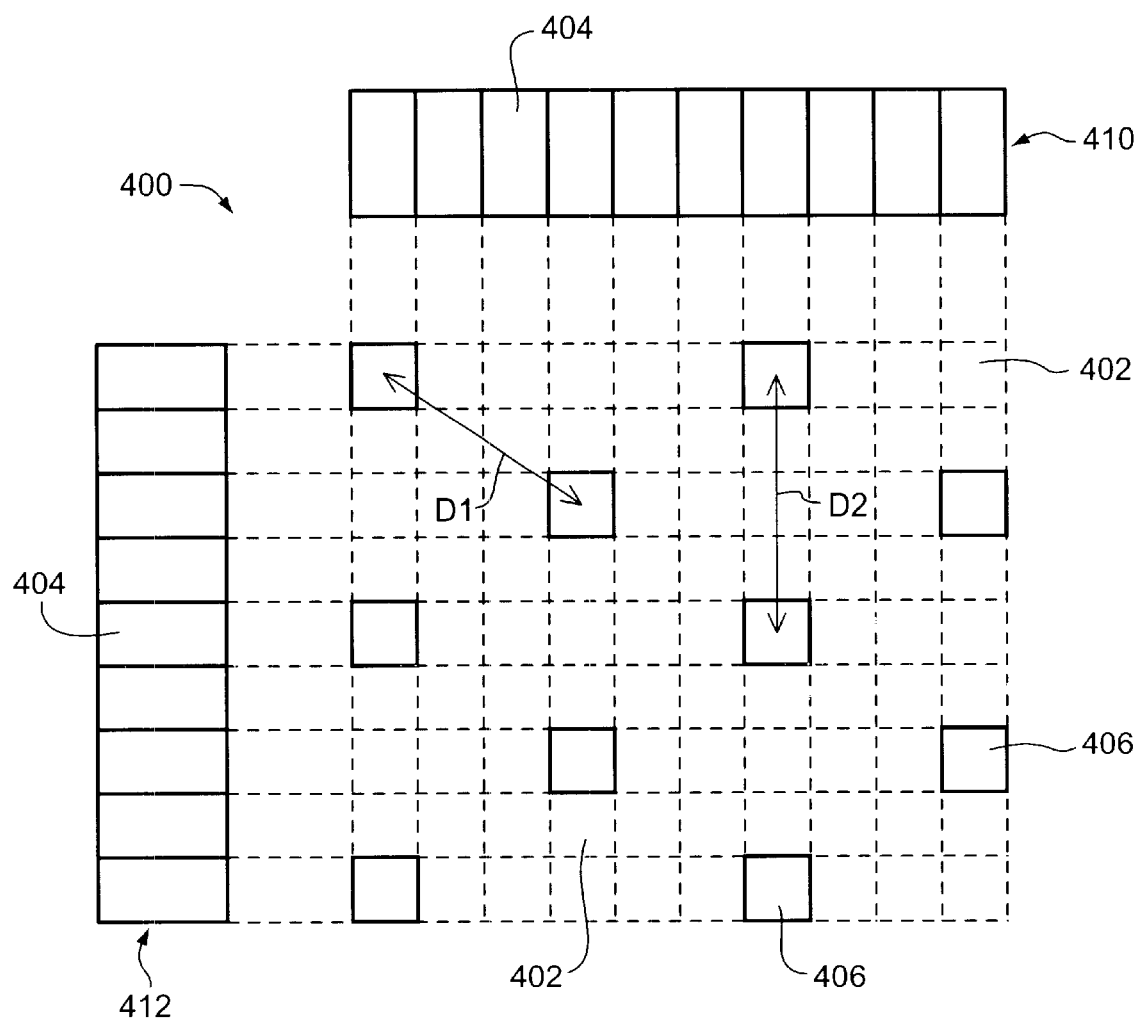
FIG. 4 illustrates a wire bond and C4 pad grid structure in one embodiment of the invention.

In FIG. 4, a grid structure 400 representing a portion of an integrated circuit device is shown in one embodiment of the present invention. A horizontal row 410 of wire bond pads 404 and a vertical row 412 of wire bond pads 404 define the grid structure 400. Each of wire bond pads 404 has a width of 68 microns and a length of 150 microns. The C4 pads 406 are located within grids 402 measuring 68 micrometers square and are patterned such that the nearest adjoining C4 pads are diagonal to one another. In the embodiment of FIG. 4, the nearest adjoining C4 pads are separated by three grids in the horizontal direction and two grids in the vertical direction. The center-to-center distance between one C4 pad and four of its nearest neighboring C4 pads is 245.2 microns (D1). The center-to-center distance between a C4 pad and its next closest neighboring C4 pad(s) is 272 microns (D2). This C4 pad layout pattern is repeatable across the entire C4 pad grid layout. This feature simplifies the pad layout and reduces the likelihood that mistakes will be made during the design process. The repeatable structure makes it easier to analyze the circuits by providing uniform wire width, resistance, spacing, etc. In addition to aligning the C4 pads 406 with the wire bond pads 404, the C4 pad layout is arranged in a manner that maximizes the C4 pad density and permits a greater spacing between the ground and power connections. This arrangement is close to an ideal hexagonal arrangement which would provide the closest possible pad density. In addition, the arrangement provides a pad configuration that is easily and repeatably wired.

Maximizing the C4 pad density provides benefits to both the power supplies and the signals. Increasing power supply pad density reduces the IR drop to the gates of the device. Increasing signal density allows the signal C4 pads to be placed closer to the edge of the die. This reduces the C4 pads impact on metal utilization, coupling to internal signals, and signal IR drop on the heavily loaded I/O signals. In addition, this reduces the length and complexity of the signal routing in the device.

It is important to note that the diagonal relationship between the C4 pads 406 and the grid size of the C4 pad grid structure 402 will vary depending upon the wire bond pad and C4 pad pitch requirements.

Thus, an integrated circuit device having both wire bond pads and C4 pads is described. Although many alterations and modifications to the present invention will no doubt become apparent to the person of ordinary skill in the art after having read the foregoing description, it is to be understood that the particular embodiments shown and described by way of illustration are in no way intended to be limiting. It is further understood that the relative dimensions, geometric shapes, and materials set forth within the specification are exemplary of the disclosed embodiments only. Other embodiments may utilize different dimensions, shapes, and materials, etc., to achieve substantially the same results.

What is claimed is:

1. An integrated circuit comprising:
   a first plirality of wire bond pads located along a horizontal axis, said first wire bond pads comprising power connections, ground connections and input/output (I/O) connections;
   a second plurality of wire bond pads located along a vertical axis, said second wire bond pads comprising power connections, ground connections and I/O connections; and
   a plurality of C4 pads arranged in a grid array, each grid defined by the intersection of one of said first wire bond pads and one of said second wire bond pads, and wherein the nearest adjoining C4 pads are located diagonal to one another, said C4 pads comprising power connections, ground connections and I/O connections, said C4 power connections being divided into a first set of vertical rows and electrically coupled to form a plurality of power buses, said C4 ground connections being divided into a second set of vertical rows to form a plurality of ground buses, each of said ground buses being located adjacent one of said power buses and at least one of said second wire bond pad power connections being coupled to one of said power buses along a trace coupling two of said C4 power connections.

2. The integrated circuit of claim 1 wherein said wire bond pads and said C4 pads are for electrically coupling to a package being coupled to said integrated circuit.

* * * * *